United States Patent [19]
Fischer

[11] Patent Number: 5,920,216
[45] Date of Patent: Jul. 6, 1999

[54] METHOD AND SYSTEM FOR GENERATING DIGITAL CLOCK SIGNALS OF PROGRAMMABLE FREQUENCY EMPLOYING PROGRAMMABLE DELAY LINES

[75] Inventor: Matthew J. Fischer, Mountain View, Calif.

[73] Assignee: Advanced Micro Devices, Inc., Sunnyvale, Calif.

[21] Appl. No.: 08/826,586

[22] Filed: Apr. 3, 1997

[51] Int. Cl.[6] ............................. H03L 7/099; H03K 5/13
[52] U.S. Cl. .......................... 327/158; 327/149; 327/114; 331/57; 331/34
[58] Field of Search ..................................... 327/105, 107, 327/113, 114–117, 145–147, 149, 150, 153, 155, 156, 158, 159, 161, 243–245, 248; 331/34, 57, 17, 25

[56] References Cited

U.S. PATENT DOCUMENTS

| | | | |
|---|---|---|---|
| 5,052,031 | 9/1991 | Molly | 327/117 |
| 5,075,640 | 12/1991 | Miyazawa | 331/34 |
| 5,162,746 | 11/1992 | Ghoshal | 327/159 |
| 5,256,980 | 10/1993 | Itri | 327/105 |
| 5,329,254 | 7/1994 | Takano | 331/17 |
| 5,389,843 | 2/1995 | McKinney | 327/276 |
| 5,490,182 | 2/1996 | Arai | 327/159 |

FOREIGN PATENT DOCUMENTS 0 528 283   8/1992   European Pat. Off. .

*Primary Examiner*—Timothy P. Callahan
*Assistant Examiner*—Eunja Shin

[57] ABSTRACT

A clock generating circuit is provided with a pair of programmable clock dividers coupled to a phase error detector for detecting a phase difference between signals corresponding to reference and clock signals. Frequency change logic produces a frequency adjustment signal that adjusts the frequency of the clock signal to eliminate the phase difference. The frequency adjustment signal is used to control a delay time in a first programmable delay chain. An updated frequency adjustment signal controls a delay time in a second programmable delay chain that receives an output signal of the first programmable delay chain. Signals delayed in the first and second programmable delay chains cause a stable clock signal at a variable frequency to be produced.

16 Claims, 5 Drawing Sheets

TYPICAL WAVEFORMS
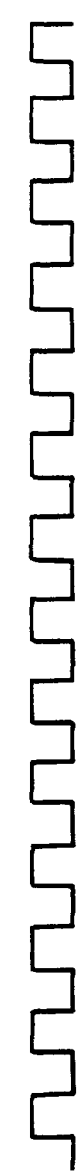 REFERENCE CLOCK
Figure 2A
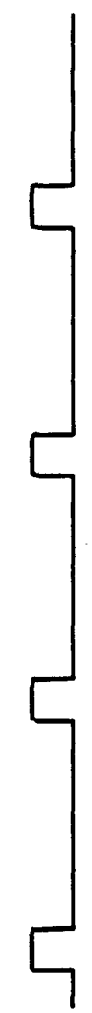 CLOCK A (A=3)
Figure 2B
 phi1
Figure 2C
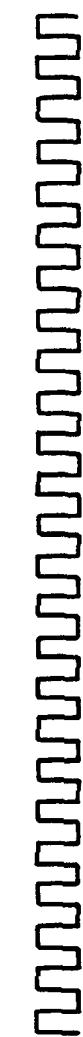 phi2
Figure 2D
 CLOCK B (N=6)
Figure 2E
PHASE_ERR_POS
Figure 2F
PHASE_ERR_NEG
Figure 2G

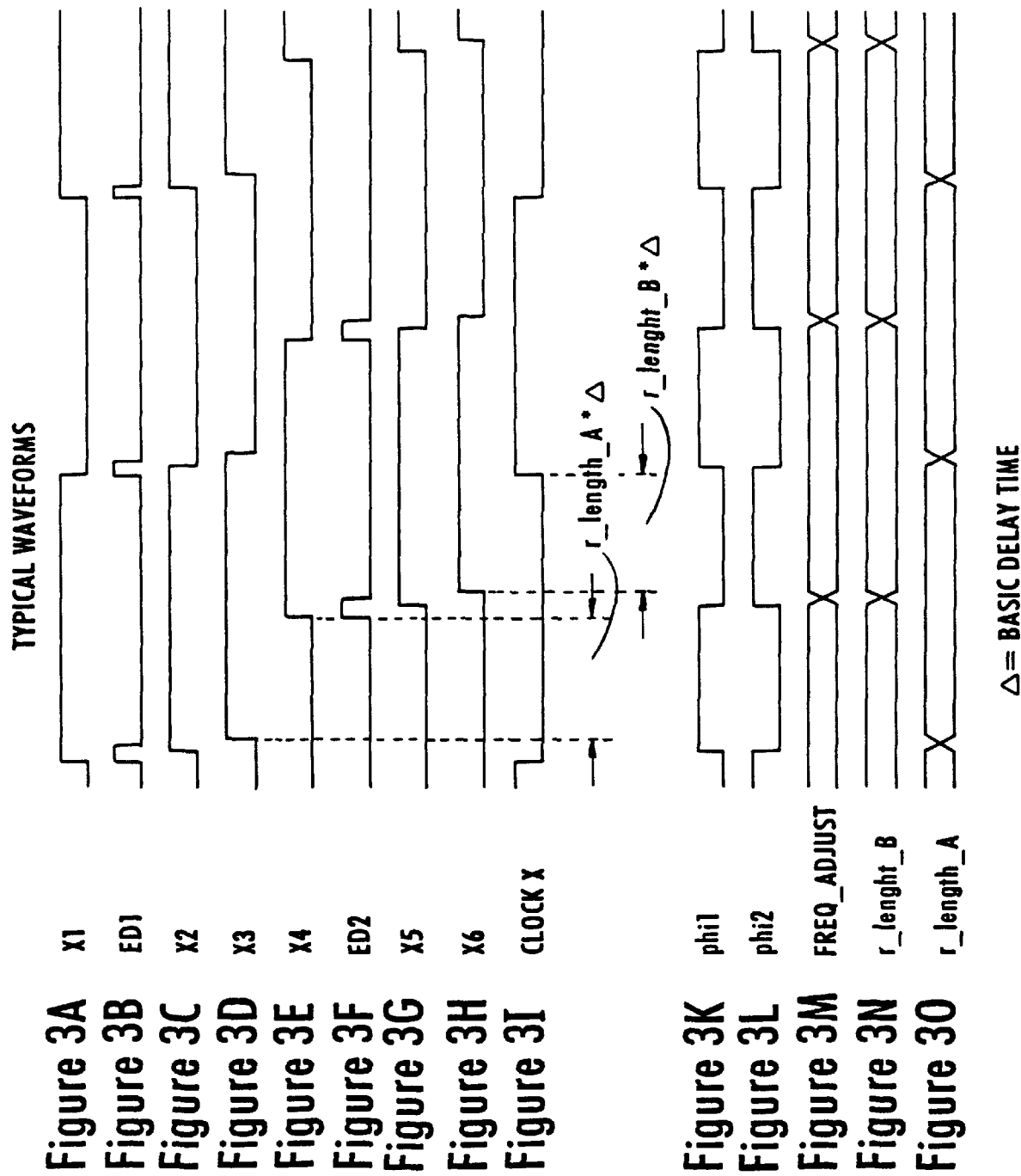

$\triangle$ = BASIC DELAY TIME

METHOD AND SYSTEM FOR GENERATING DIGITAL CLOCK SIGNALS OF PROGRAMMABLE FREQUENCY EMPLOYING PROGRAMMABLE DELAY LINES

TECHNICAL FIELD

The present invention relates to digital logic devices, and more particularly, to a novel digital frequency synthesizer that produces clock signals of programmable frequency using a programmable delay line.

BACKGROUND ART

In digital circuits, clock signals are required to provide synchronization between various operations. Crystal oscillators are often employed as highly stable reference frequency sources to generate digital clock signals.

For many applications, it is necessary to operate a digital circuit at more than one frequency. For example, during a period of time in which digital operations are not needed, the frequency of the digital clock may be slowed down in order to save power.

Multiple crystal oscillators may be used to generate clock signals at a variable frequency. However, as crystal oscillators are expensive devices, it would be desirable to produce independent digital clock signals of various frequencies using a single crystal oscillator.

Also, it would be desirable to provide a digitally programmable circuit for generating digital clock signals of various programmable frequencies.

DISCLOSURE OF THE INVENTION

Accordingly, one advantage of the invention is in providing a circuit for producing independent digital clock signals of various frequencies using a single crystal oscillator.

Another advantage of the invention is in providing a digitally programmable circuit for generating digital clock signals of various programmable frequencies.

The above and other advantages of the invention are achieved, at least in part, by providing a clock generating system comprising a first input device that converts a reference signal into a first input signal having a frequency proportional to a frequency of the reference signal, and a second input device that converts a clock input signal into a second input signal having a frequency proportional to a clock frequency. A phase error detector coupled to the first and second input devices produces an error signal that indicates a phase difference between the first input signal and the second input signal. Control circuitry coupled to the phase error detector produces a control signal for adjusting the frequency of the clock input signal to eliminate the phase difference. Delay circuitry is provided with a control input coupled to the control circuitry for programming a delay time of the delay circuitry to generate the clock signal at the clock frequency.

In accordance with a first aspect of the invention, the delay circuitry may comprise a first programmable delay chain having a first programmable delay time defined by a first value of the control signal in a first time period, and a second programmable delay chain for delaying a signal delayed by the first programmable delay chain. The second programmable delay chain has a second programmable delay time defined by a second value of the control signal in a second time period following the first time period.

In accordance with a further aspect of the invention, the delay circuitry may further comprise a first edge detector for producing a first signal edge supplied to the first programmable delay chain, and a second edge detector coupled to an output of the first programmable delay chain for producing a second signal edge delayed with respect to the first signal edge by a first delay amount including the first programmable delay time. The second programmable delay chain may produce a feedback clock signal supplied to the first edge detector and delayed with respect to the second signal edge by a second delay amount including the second programmable delay time. The first edge detector may set the clock signal into a first logic state. The second edge detector may reset the clock signal into a second logic state.

In accordance with another aspect of the invention, each of the first and second programmable delay chains may comprise a set of multiplexers having control inputs supplied by components of the control signal. The multiplexers may have first inputs coupled to delay lines, and second inputs coupled to outputs of the preceding multiplexers. The number of the multiplexers may correspond to the number of bits in the control signal.

In accordance with a further aspect of the invention, the control circuitry may comprise frequency change logic for producing a frequency adjustment signal. A first register may be arranged for storing the first value of the control signal supplied to the first programmable delay chain. In response to the frequency adjustment signal, an update logic circuit may update the first value of the control signal.

A second register may be arranged for storing the second value of the control signal supplied to the second programmable delay chain. The second register may receive the first value of the control signal from the first register updated by the update logic circuit after the first value is supplied to the first programmable delay chain. The update logic circuit may comprise an adder for adding a value of the frequency adjustment signal to the first value of the control signal supplied from the first register.

In accordance with the method of the present invention, the following steps are carried out for generating a clock signal at a variable clock frequency:

producing a first input signal having a frequency proportional to a reference frequency, producing a second input signal having a frequency proportional to the clock frequency, comparing the first and second input signals to generate a phase error signal, producing a frequency control signal for adjusting the clock frequency to eliminate the phase error signal, and delaying a signal edge by a programmable time defined by the frequency control signal to produce the clock signal at the clock frequency.

The step of delaying may comprise the step of delaying the signal edge by a first programmable time defined by a first value of the frequency control signal in a first time period, and the step of further delaying the delayed signal edge by a second programmable time defined by a second value of the frequency control signal in a second time period following the first time period.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention.

Accordingly, the drawings and description are to be regarded as illustrative in nature, and not as restrictive.

BRIEF DESCRIPTION OF DRAWINGS

FIGS. 2A–2G and 3A–3O are waveform diagrams that illustrate the operation of the clock generating circuit.

BEST MODE FOR CARRYING OUT THE INVENTION

Figure 1:
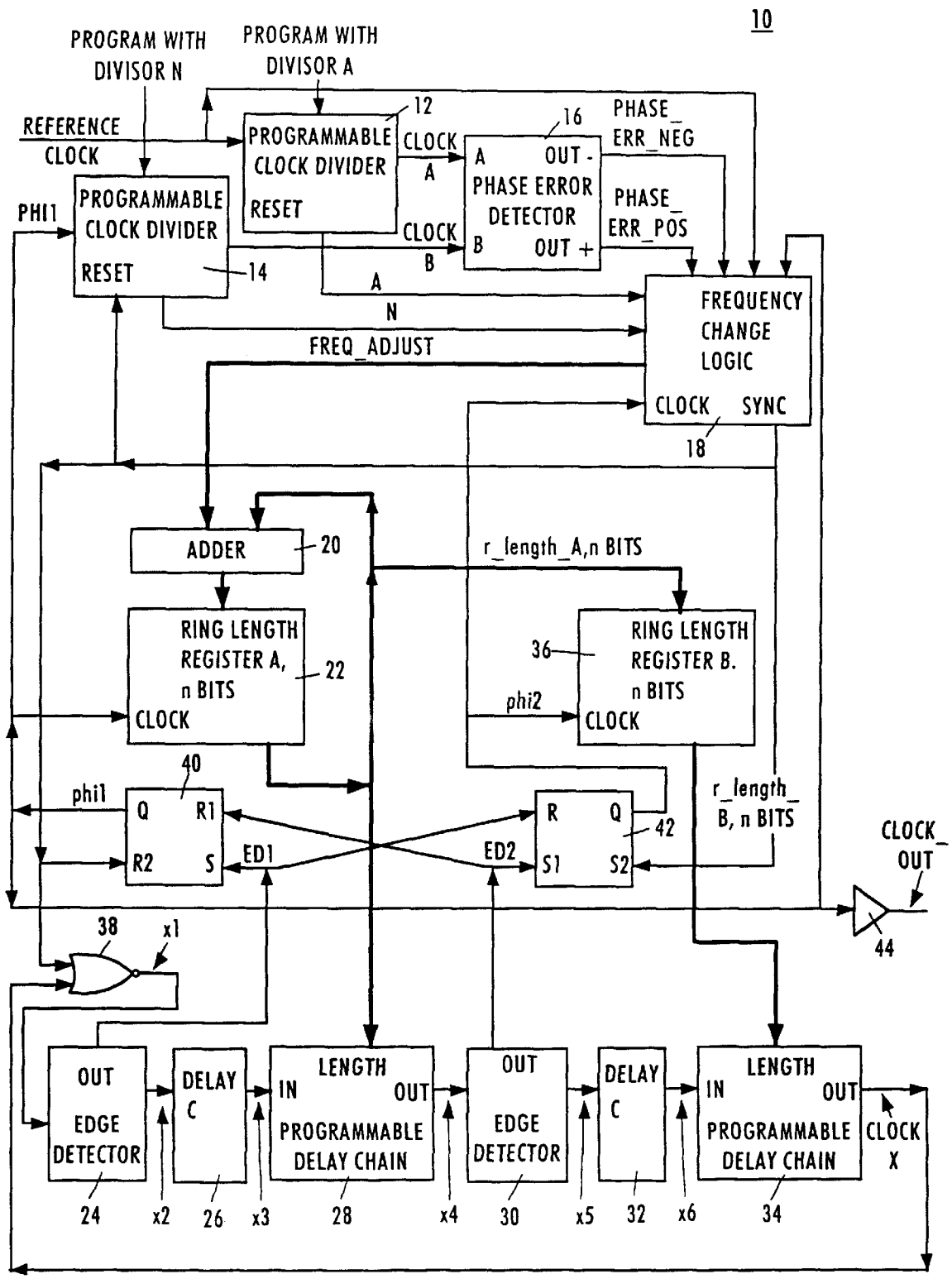
FIG. 1 is a block diagram of a clock generating circuit in accordance with a first embodiment of the present invention.

The best mode for practicing the invention is based on the realization of a circuit for generating digital clock signals. However, it is to be understood that the present invention is applicable to any frequency synthesizer using delay line technique to generate a signal at a specified frequency.

Referring to FIGS. 1 and 2A–2G, a clock generating circuit 10 comprises a programmable clock divider 12 supplied with a reference clock signal (FIG. 2A) produced, for example, by an external crystal oscillator. The clock divider 12 divides the frequency of the reference clock signal by A. External programming logic may control the clock divisor 12 to program a value of its divisor A in accordance with a required clock frequency at the output of circuit 10. For example, as shown in FIG. 2B, the divisor A may be equal to 3 to produce a clock A signal at the output of the clock divider 12. The clock A signal may be a pulse of a duration at least equal to the duration of the reference clock signal. The frequency of the clock A signal is equal to the frequency of the reference clock signal divided by A.

A programmable clock divider 14 is supplied with an internally produced phi1 clock signal (FIG. 2C), generation of which is discussed later. The clock divider 14 divides the frequency of the phi1 clock signal by N. External programming logic may control the clock divider 14 to program a value of its divisor N in accordance with a required clock frequency at the output of circuit 10. For example, as shown in FIG. 2E, the divisor N may be set to 6 to produce a clock B signal at the output of the clock divider 14. The clock B signal may be a pulse of a duration at least equal to the duration of the phi1 clock signal. The frequency of the clock B signal is equal to the frequency of the phi1 clock signal divided by N.

The clock A and clock B signals are respectively fed to inputs A and B of a phase error detector 16 that determines a phase error equal to a time interval between edges of the clock A and clock B signals. The phase error detector 16 has a negative output OUT− and a positive output OUT+. A phase_err_pos pulse (FIG. 2F) is produced at the positive output OUT+ when the clock B signal is delayed with respect to the clock A signal. A phase_err_neg pulse is produced at the output OUT− when the clock A signal is delayed with respect to the clock B signal. Values of the phase_err_pos and phase_err_neg signals are proportional to the time interval between the edges of clock A and clock B signals.

The phase_err_pos and phase_err_neg signals, the reference clock signal and the values of divisors A and N are fed into frequency change logic 18 that analyzes the phase error between the clock A and clock B signals, and the ratio of the values A and N. To eliminate the phase error, the frequency change logic 18 initiates the adjustment of the frequency of the phi1 clock signal to satisfy the following equation:

$$f_{phi1} = f_{ref} \times N/A,$$

where $f_{phi1}$ is the frequency of the phi1 clock signal that corresponds to a frequency of a clock out signal generated at the output of circuit 10, $f_{ref}$ is the frequency of the reference clock signal, N/A is the ratio of the divisor values N and A.

To adjust the frequency $f_{phi1}$, the frequency change logic 18 produces a digital frequency adjustment signal freq_adjust supplied to a first input of a two's complement adder 20. Another input of the adder 20 receives an n-bit ring length A signal r_length_A that represents a value stored in an n-bit ring length register A designated by reference number 22. The frequency adjustment signal freq_adjust contains n−1 bits. As discussed in more detail later, the ring length A value is used to control signal delays in one of the programmable delay chains employed in the clock generating circuit 10.

The adder 20 adds the frequency adjust value to the existing ring length A value to produce an adjusted ring length A value supplied to the register 22. The frequency adjustment value may be positive or negative depending upon the correction desired.

The frequency change logic 18 has its clock input supplied with a phi2 clock signal (FIG. 2D), generation of which will be discussed later. The phi2 clock signal has the same frequency as the phi1 clock signal but is out of phase with respect to this clock signal. The frequency adjust values produced by the frequency change logic 18 are updated at rising edges of the phi2 signal.

Also, the frequency change logic 18 produces a sync output signal at its sync output. The sync output signal is asserted at falling edges of the phi1 signal, and is deasserted at rising edges of the reference clock signal. The sync output signal is supplied to various elements of the clock generating circuit 10 to synchronize an edge of a resulting clock out signal generated by the circuit 10 with the reference clock signal. This synchronization may be provided in response to such events as a change in either the A or N value, a change in both the A and N values, a reset of the circuit 10, or a power reset condition. It should be understood that other circuit events also may initiate the synchronization of the clock out signal with the reference clock signal. The frequency change logic 18 detects the synchronizing events using the signals supplied to its inputs. When any of the synchronizing events in the circuit 10 is detected, the frequency change logic 18 asserts the sync signal. In response, the resulting clock out signal is held in a low state until the sync signal is deasserted. The programmable clock dividers 12 and 14 that receive the sync signal at their respective reset inputs are cleared when the sync signal is asserted. Also, the assertion of the sync signal interrupts the propagation of signals through a delay system discussed later.

The frequency change logic 18 does not necessarily adjust the frequency $f_{phi1}$ for each cycle of the phi1 or phi2 clock signal. When phase errors detected by the phase error detector 16 are larger than a single cycle of the phi1 or phi2 clock signal, the phase error measurement takes multiple cycles of the phi1 or phi2 signal. Until the phase error measurement is completed, no frequency adjustment signal is produced at the output of the frequency change logic 18.

At the end of the measurement, the frequency change logic 18 produces a single, large frequency adjustment value supplied to the adder 20.

Alternatively, the frequency change logic 18 may produce the frequency adjust signal even while the phase error is still being measured. As soon as the frequency change logic 18 detects that the phase error is greater than a single phi1 or phi2 clock signal cycle, the frequency adjust signal is produced to modify the frequency $f_{phi1}$ in accordance with the detected component of the phase error. The frequency change logic 18 may continue to make such adjustments until the entire phase error is determined.

The output value of the adder 20 is loaded into the ring length register 22 at the rising edge of the phi1 clock signal supplied to the clock input of the register 22. The adder output value replaces the old ring length A value in the register 22. The new ring length A value is used to set a delay time for a delay system employed in the clock generating circuit 10.

The delay system comprises an edge detector 24 that detects an edge of an X1 signal supplied to the delay system. A delay unit 26 is coupled to the edge detector 24 to delay a signal X2 produced by the edge detector 24 by a fixed delay value C. A programmable delay chain 28 is coupled to the delay unit 26 to delay a signal X3 at the output of the delay unit 26 by a programmable delay value defined by the new ring length A value from the register 22. An edge detector 30 detects an edge of a signal X4 produced by the programmable delay chain 28. A delay unit 32 is coupled to the edge detector 30 to delay a signal X5 produced by the edge detector 30 by a fixed delay value C. A programmable delay chain 34 is coupled to the delay unit 32 to delay a signal X6 at the output of the delay unit 32 by a programmable delay value defined by a ring length B value read from a ring length register B designated by reference number 36. A clock X signal produced by the programmable delay chain 34 is fed back to the edge detector 24 via a first input of a NOR gate 38. Another input of the NOR gate 38 is supplied by the sync signal from the frequency change logic 18.

Reference is now made to FIGS. 3A–3O that illustrate various signals produced in the clock generating circuit 10. When an edge of the signal X1 (FIG. 3A) is detected by the edge detector 24, an ed1 signal (FIG. 3B) is produced at the output OUT of the detector 24. The edge detector 24 may respond to both rising and falling edges at its input by producing a positive pulse at its output OUT. The ed1 signal is fed into the set input S of an asyncronous S-R flip flop 40 having reset inputs R1 and R2. When the set input S is activated, and the reset inputs R1 and R2 are inactive, an output Q of the flip flop 40 is activated. When any of the reset inputs R1 and R2 is activated and the set input S is inactive, the output Q becomes inactive.

The ed1 signal supplied to the set input S, causes the rising edge of the phi1 clock signal (FIG. 3K) to be produced at the Q output. At the rising edge of the phi1 signal, a new ring length value A (FIG. 3O) is supplied to the register 22 which sends the ring length A signal that represents the ring length A value via the length input to the programmable delay chain 28.

Simultaneously, the X1 signal edge propagates via the edge detector 26 to produce the X2 signal (FIG. 3C). The delay unit 26 delays the X2 signal by the fixed delay value C that compensates for the propagation of the ring length A signal via internal circuitry of the programmable delay chain 28. As a result, the edge of the X3 signal (FIG. 3D) is delayed with respect to the edge of the X1 signal by the time required for generation of the phi1 signal edge, and setting the programmable delay value of the delay chain 28 in response to the ring length A signal.

Thus, when the X3 signal edge is supplied to the programmable delay chain 28 via its signal input (in), the delay value of the chain 28 is set to provide delay by the amount equal to the ring length A value multiplied by a basic delay time of the chain 28. The basic delay time may be equal to the propagation time through a delay line composed, for example, of a pair of inverters. It should be understood that other delay structures may be used instead of pairs of inverters.

The edge of the X4 signal (FIG. 3E) at the output (out) of the programmable delay chain 28 is detected by the edge detector 30 that produces an ed2 signal (FIG. 3F) at its output OUT. The ed2 signal is fed into the reset input R1 of the flip flop 40 to deassert the phi1 signal at its Q output.

Also, the ed2 signal is supplied to an asyncronous S-R flip flop 42 having set inputs S1 and S2 and a reset input R1. When any of the set inputs S1 and S2 are activated, and the reset input R1 is inactive, an output Q of the flip flop 42 is activated. When the reset input R1 is activated and the set inputs S1 and S2 are inactive, the output Q becomes inactive. The ed2 signal is supplied to the set input S1 causing the rising edge of the phi2 clock signal (FIG. 3L) to be produced at the Q output of the flip flop 42.

At the rising edge of the phi2 signal, the latest ring length value A is supplied to the ring length register B designated by reference number 36. As a result, the register 36 stores an n-bit ring length value B (FIG. 3N) that corresponds to the latest ring value produced in the register 22 after the latest frequency adjustment signal (FIG. 3M) is generated by the frequency change logic 18 to adjust the $f_{phi1}$ frequency. The ring length B signal that represents the ring length B value is supplied to the length input of the programmable delay chain 34.

Simultaneously, the X4 signal edge propagates via the edge detector 30 to produce the X5 signal (FIG. 3G). The delay unit 32 delays the X5 signal by the fixed delay value C that compensates for the propagation of the ring length B signal via internal circuitry of the programmable delay chain 34. As a result, the edge of the X6 signal (FIG. 3H) is delayed with respect to the edge of the X4 signal by the time required for generation of the phi2 signal edge, and setting the programmable delay value of the delay chain 34 in response to the ring length B signal.

Thus, when the X6 signal edge is supplied to the programmable delay chain 34 via its signal input (in), the delay value of the chain 34 is set to provide delay by the amount equal to the ring length B value multiplied by a basic delay time of the chain 34. The basic delay time values for the chains 28 and 34 may be equal.

The clock X signal (FIG. 3I) produced at the output (out) of the programmable delay chain 34 via the NOR gate 38 is fed back to the input of the delay system.

Thus, the programmable delay chains 28 and 34 may be programmably controlled to provide the highly accurate adjustment of the phi1 signal at any required frequency. The phi1 signal is fed into an output invertor 44 to produce the clock out signal supplied from the output of the clock generating circuit 10.

Figure 4:
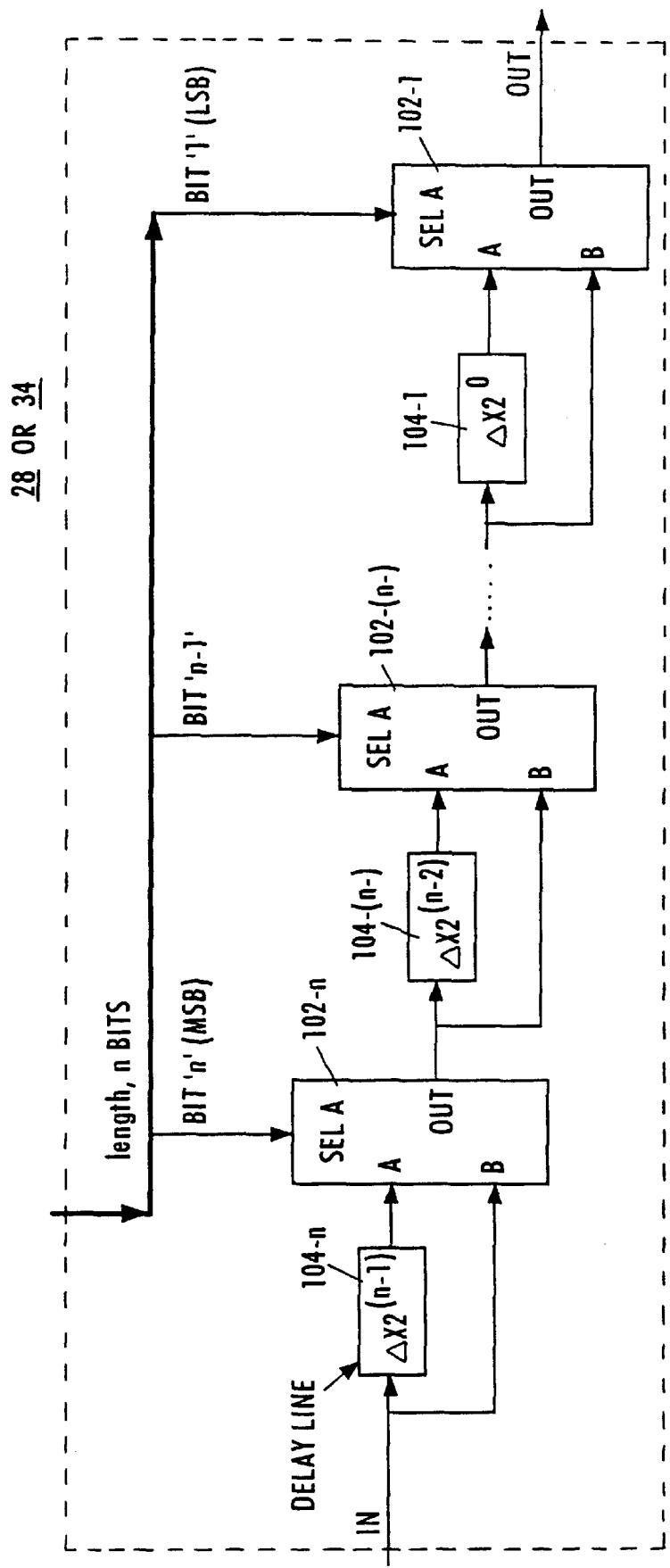
FIG. 4 is a block diagram of a programmable delay chain in accordance with the present invention.

Referring to FIG. 4, each of the programmable delay chains 28 and 34 comprises a set of multiplexers 102-1, 102-2, ..., 102-(n−1), 102-n having their select inputs SelA connected to receive bits 1, 2, ..., n−1, n of a ring length value A or B supplied by the register 22 or register 36 via the length input of the delay chain 28 or delay chain 34, respectively. The bit 1 is the least significant bit (LSB) of the corresponding ring length value, whereas bit n is the most significant bit (MSB).

Inputs A of the multiplexers 102-1, 102-2, ..., 102-(n−1), 102-n are respectively connected to delay lines 104-1, 104-2, ..., 104-(n−1), 104-n. Input B of each of the multiplexers 102-(n−1) to 102-1 is coupled to an output of the preceding multiplexer. In particular, input B of the last multiplexer 102-1 is connected to the output of the multiplexer 102-2, which in turn has its input B connected to the output of the multiplexer 102-3, etc. Input B of the multiplexer 102-n is connected to the input (in) of the delay chain 28 or 34. As discussed above, the input (in) of the delay chain 28 is coupled to the output of the delay unit 26, and the input (in) of the delay chain 34 is coupled to the output of the delay unit 32.

Each of the delay lines 102-1, 102-2, ..., 102-(n−1), 102-n provides a delay by a fixed amount equal to the basic delay time $\Delta$ multiplied by $2^0, 2^1, \ldots, 2^{n-2}, 2^{n-1}$, respectively. Accordingly, bit i of the ring length value A or B supplied to a multiplexer 102-i of the programmable delay chain 28 or 34 provides selection between a delay of $\Delta * 2^{i-1}$ and 0. For example, if the bit i is set to a logical 1, the multiplexer 102-i connects its input A to its output in order to provide delay by $\Delta * 2^{i-1}$. If the bit i is set to logical 0, the multiplier 102-i connects its input B to its output to repeat the output signal of the preceding multiplexer 102-(i+1) at the output of the next multiplexer 102-i. If the first multiplexer 102-n is controlled to connect its input B to its output, the signal X3 or X6 is fed into the output of the multiplexer 102-n. The output of the last multiplexer 102-1 in the delay chain 28 produces the X4 signal, and the output of the last multiplexer 102-1 in the delay chain 28 produces the clock X signal.

Thus, the arrangement of each programmable delay chain 28 and 34 provides a programmable delay time proportional to the binary value of ring length value A or B, respectively. The delay time of each of the delay chains 28 and 34 may be adjusted immediately before an edge of an input signal enters the corresponding delay chain. The delay chain arrangement suggests an upper limit for changes in the total delay time for each phi1 or phi2 clock cycle. The total delay time may be changed by the existing ring length A value, without creating glitches on the clock out signal.

Figure 5:
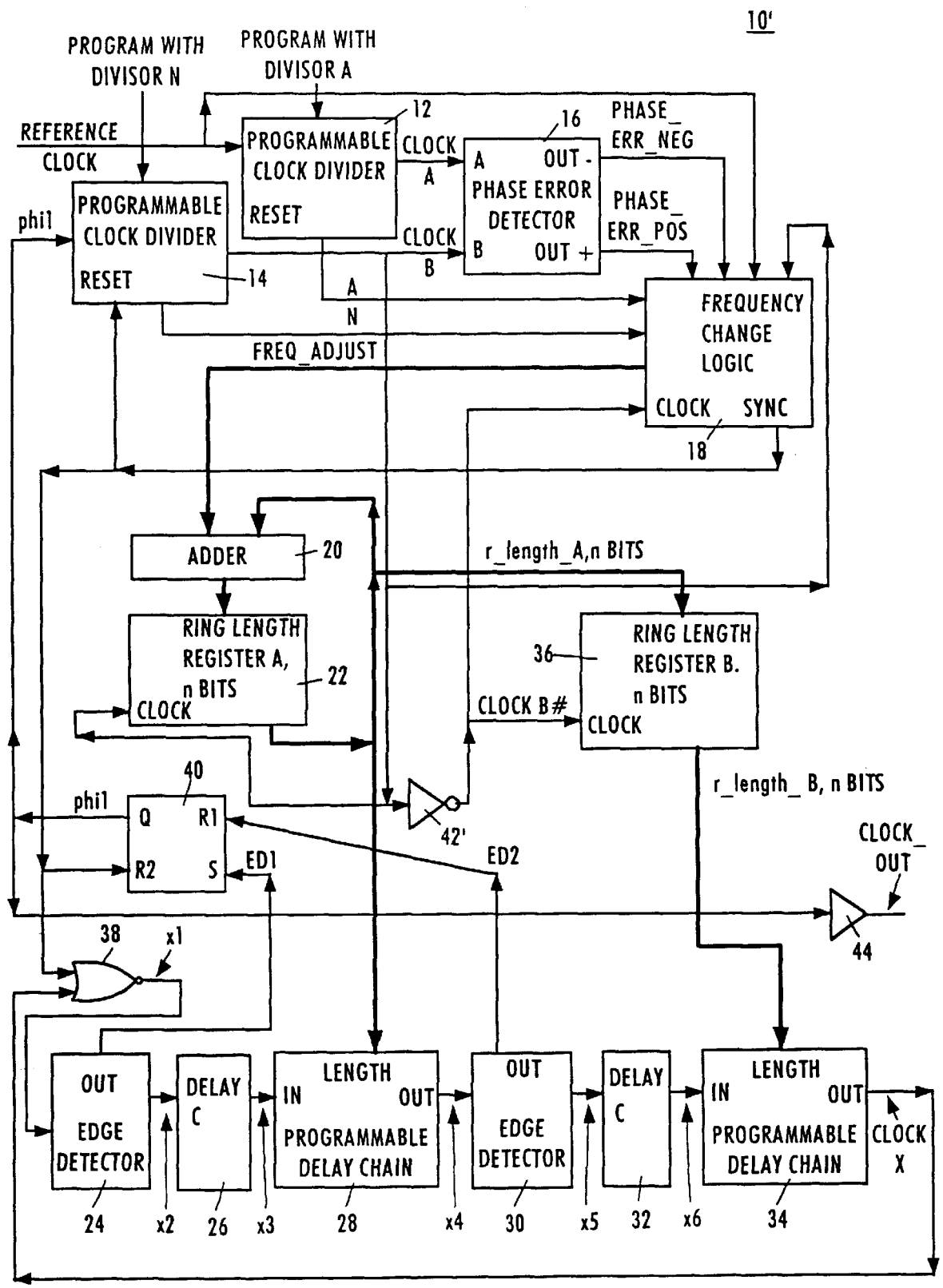
FIG. 5 is a block diagram of a clock generating circuit in accordance with a second embodiment of the present invention.

When the phi1 or phi2 clock cycle is very short, an alternative embodiment of the present invention shown in FIG. 5 may be preferred. In the alternative embodiment, instead of the phi1 clock, the clock B signal is fed into the ring length register A, and the phi2 signal supplied to the ring length register B is replaced with the inverted clock B signal (clock B#). Alternatively, the ring length registers A and B may be supplied by any signals produced by the division of the phi1 and phi2 frequencies by an integer.

Referring to FIG. 5, the clock generating circuit 10' according to the alternative embodiment of the present invention contains an inverter 42' that replaces the S-R flip flop 42. The programmable clock divider 14 supplies the clock B signal to the clock input of the ring length register A, and the input of the inverter 42'. The clock B# signal produced at the output of the inverter 42' is fed to the clock input of the ring length register B and the clock input of the frequency change logic 18. This arrangement gives more time to such logic circuits as the adder 20 and the frequency change logic 18 to perform their logic functions.

There accordingly has been described a clock generating circuit that comprises a pair of programmable clock dividers coupled to a phase error detector for detecting a phase difference between signals corresponding to reference and clock signals. Frequency change logic produces a frequency adjustment signal that adjusts the frequency of the clock signal to eliminate the phase difference. The frequency adjustment signal is used to control a delay time in a first programmable delay chain. An updated frequency adjustment signal controls a delay time in a second programmable delay chain that receives an output signal of the first programmable delay chain. Signals delayed in the first and second programmable delay chains cause a stable clock signal at a variable frequency to be produced.

In this disclosure, there are shown and described only the preferred embodiments of the invention, but it is to be understood that the invention is capable of changes and modifications within the scope of the inventive concept as expressed herein.

What is claimed is:

1. A system for generating a clock signal at a variable clock frequency, comprising:

a first input device arranged to convert a reference signal into a first input signal having a frequency proportional to a frequency of the reference signal, a second input device arranged to convert a clock input signal into a second input signal having a frequency proportional to the variable clock frequency, a phase error detector coupled to said first and second input devices for producing an error signal indicating a phase difference between said first input signal and said second input signal, control circuitry coupled to said phase error detector for producing a control signal to adjust the frequency of said clock input signal to eliminate the phase difference, and delay circuitry having a control input coupled to said control circuitry for programming a delay time of said delay circuitry to generate said clock signal at the variable clock frequency, said delay circuitry comprising:

a first programmable delay chain having a first programmable delay time defined by a first value of said control signal in a first time period, and a second programmable delay chain for delaying a signal delayed by said first programmable delay chain, said second programmable delay chain having a second programmable delay time defined by a second value of said control signal in a second time period following said first time period.

2. The system of claim 1, wherein said delay circuitry further comprises a first edge detector for producing a first signal edge supplied to said first programmable delay chain.

3. The system of claim 2, wherein said delay circuitry further comprises a second edge detector coupled to an output of said first programmable delay chain for producing a second signal edge delayed with respect to said first signal edge by a first delay amount including said first programmable delay time.

4. The system of claim 3, wherein said second programmable delay chain produces a feedback clock signal supplied to said first edge detector and delayed with respect to said second signal edge by a second delay amount including said second programmable delay time.

5. The system of claim 4, wherein said first signal edge sets said clock signal into a first logic state.

6. The system of claim 5, wherein said second signal edge resets said clock signal into a second logic state.

7. The system of claim 1, wherein each of said first and second programmable delay chains comprises a set of multiplexers having control inputs supplied by components of said control signal.

8. The system of claim 7, wherein said multiplexers have first inputs coupled to delay lines, and second inputs coupled to outputs of the preceding multiplexers.

9. The system of claim 8, wherein a number of said multiplexers corresponds to a number of bits in said control signal.

10. The system of claim 1, wherein said control circuitry comprises frequency change logic for producing a frequency adjustment signal.

11. The system of claim 10, wherein said control circuitry further comprises a first register for storing the first value of said control signal supplied to said first programmable delay chain.

12. The system of claim 11, wherein said control circuitry further comprises an update logic circuit responsive to said frequency adjustment signal for updating the first value of said control signal.

13. The system of claim 12, wherein said control circuitry further comprises a second register for storing the second value of said control signal supplied to said second programmable delay chain.

14. The system of claim 13, wherein said second register receives the first value of said control signal from said first register updated by said update logic circuit after the first value is supplied to said first programmable delay chain.

15. The system of claim 14, wherein said update logic circuit comprises an adder for adding a value of said frequency adjustment signal to the first value of said control signal from said first register.

16. A method for generating a clock signal at a variable clock frequency, comprising the steps of:

producing a first input signal having a frequency proportional to a reference frequency, producing a second input signal having a frequency proportional to the variable clock frequency, comparing said first and second input signals to generate a phase error signal, producing a frequency control signal for adjusting the clock frequency to eliminate the phase error signal, delaying a signal edge by a first programmable time defined by a first value of said frequency control signal in a first time period, and further delaying the delayed signal edge by a second programmable time defined by a second value of said frequency control signal in a second time period following the first time period, to produce the clock signal at the variable clock frequency.

* * * * *